(12) United States Patent
Honarparvar et al.

(10) Patent No.: US 10,826,514 B1
(45) Date of Patent: Nov. 3, 2020

(54) NOISE-SHAPING ENHANCED GATED RING OSCILLATOR BASED ANALOG-TO-DIGITAL CONVERTERS

(71) Applicant: Ciena Corporation, Hanover, MD (US)

(72) Inventors: Mohammad Honarparvar, Gatineau (CA); Soheyl Ziabakhsh Shalmani, Kanata (CA); Naim Ben-Hamida, Nepean (CA); Sadok Aouini, Gatineau (CA)

(73) Assignee: Ciena Corporation, Hanover, MD (US)

( * ) Notice: Subject to any disclaimer, the term of this patent is extended or adjusted under 35 U.S.C. 154(b) by 0 days.

(21) Appl. No.: 16/653,066

(22) Filed: Oct. 15, 2019

(51) Int. Cl.
- *H03M 1/08* (2006.01)
- *H03M 1/12* (2006.01)
- *H03K 3/03* (2006.01)
- *G04F 10/00* (2006.01)

(52) U.S. Cl.
CPC ........ *H03M 1/0854* (2013.01); *G04F 10/005* (2013.01); *H03K 3/0315* (2013.01); *H03M 1/1245* (2013.01)

(58) Field of Classification Search
CPC .......... H03M 1/0854; H03M 1/1245; H03K 3/0315; G04F 10/005
USPC ........ 341/143, 200; 250/340, 339.1
See application file for complete search history.

(56) References Cited

U.S. PATENT DOCUMENTS

| | | | |
|---|---|---|---|
| 8,531,322 B2 * | 9/2013 | Cao | G04F 10/005 324/160 |
| 8,564,471 B1 * | 10/2013 | Gao | G04F 10/005 341/166 |
| 8,779,951 B2 * | 7/2014 | Uemori | G01R 25/00 341/111 |
| 8,878,614 B2 * | 11/2014 | Yin | H03L 7/099 327/147 |
| 9,360,503 B2 * | 6/2016 | Gazsi | G04D 7/003 |
| 9,455,667 B2 * | 9/2016 | Vlachogiannakis | H03B 5/1265 |
| 9,825,645 B1 * | 11/2017 | Gaggl | H03M 3/422 |
| 9,900,538 B2 * | 2/2018 | Le-Thai | H04N 5/378 |
| 10,067,478 B1 * | 9/2018 | Kolar Ranganathan | H03K 5/1534 |
| 10,454,483 B2 * | 10/2019 | Moore | G04F 10/005 |
| 2008/0158711 A1 * | 7/2008 | Bliss | G11B 20/10425 360/70 |

(Continued)

*Primary Examiner* — Lam T Mai
(74) *Attorney, Agent, or Firm* — Young Basile Hanlon & MacFarlane, P.C.

(57) ABSTRACT

A noise-shaping enhanced (NSE) gated ring oscillator (GRO)-based ADC includes a delay which delays and feedbacks an error signal to an input of the NSE GRO-based ADC. The feedback error signal provides an order of noise-shaping and the error signal is generated at the input of the NSE GRO-based ADC from an input signal, the feedback error signal, and a front-end output. A voltage-to-time converter converts the error signal to the time domain. A GRO outputs phase signals from the time domain error signal by oscillating when the error signal is high and inhibiting oscillation otherwise. A quantization device quantizes the phase signals to generate the front-end output. A quantization extraction device determines a quantization error from the quantized phase signals. A time-to-digital converter digitizes the quantization error to generate a back-end output. An output device generates a second order noise-shaped output based on the front-end and the back-end outputs.

20 Claims, 7 Drawing Sheets

(56) References Cited

U.S. PATENT DOCUMENTS

| | | | |
|---|---|---|---|
| 2012/0062286 A1* | 3/2012 | Ginsburg | H01Q 1/2283 |
| | | | 327/148 |
| 2012/0261579 A1* | 10/2012 | Ramaswamy | H01Q 3/26 |
| | | | 250/340 |
| 2012/0286987 A1* | 11/2012 | Kawaguchi | H03M 3/416 |
| | | | 341/166 |
| 2013/0307713 A1* | 11/2013 | Kawaguchi | G04F 10/005 |
| | | | 341/166 |
| 2014/0240157 A1* | 8/2014 | Noh | H03M 1/60 |
| | | | 341/155 |
| 2016/0238998 A1* | 8/2016 | Pavlovic | H03C 3/0941 |
| 2016/0241301 A1* | 8/2016 | Pavlovic | H03C 3/0958 |
| 2017/0244544 A1* | 8/2017 | Galton | H03L 7/093 |
| 2017/0322520 A1* | 11/2017 | Wu | H03M 1/50 |
| 2017/0329284 A1* | 11/2017 | Wu | G04F 10/005 |
| 2019/0187628 A1* | 6/2019 | Chu | H01J 49/40 |
| 2019/0243312 A1* | 8/2019 | Chu | H03K 21/38 |
| 2020/0158836 A1* | 5/2020 | Henderson | G01S 17/89 |

\* cited by examiner

NOISE-SHAPING ENHANCED GATED RING OSCILLATOR BASED ANALOG-TO-DIGITAL CONVERTERS

TECHNICAL FIELD

This disclosure relates to analog-to-digital converters (ADCs). More specifically, this disclosure relates to noise-shaping enhanced gated ring oscillator-based ADCs.

BACKGROUND

Increasing bandwidth in telecommunications systems is always a major focus. These systems use analog-to-digital converters (ADCs) to convert analog signals to digital values. An ongoing challenge for these ADCs is to meet power consumption requirements. For example, a digital-intensive receiver, power-efficient ADC having tens of MHz in bandwidth is a crucial block which has to meet stringent power consumption requirements. Continuous time (CT) delta sigma modulators (ΔΣMs) may be a good option for this purpose. However, a significant power budget must be allotted to the operational amplifiers (op-amps) utilized in high-order CT ΔΣMs. Voltage-controlled oscillator based quantizers (VCOQ) may be used to eliminate op-amps. However, the resolution of the VCOQs are limited by the nonlinearity caused by the VCO's voltage-to-frequency (V-to-F) transfer characteristic. That is, VCOs show a severe nonlinearity which may require the use of high order feedback loops to suppress such nonlinearities. However, power hungry op-amps are required to realize the feedback loop. ADCs which rely on op-amps are impractical for use in ultra-high-speed applications such as telecommunications.

Gated ring oscillator (GRO)-based ADCs may be used to mitigate the above drawbacks. GRO-based ADCs may be employed as a multi stage noise shaping (MASH) 1-1 or as a quantizer in a CT MASH 3-1 ΔΣM. In the former ADC, noise shaping is limited to an order of two as cascading an infinite number of GRO-based ADCs to achieve a higher order MASH ΔΣM is problematic because the quantization noise becomes narrower for the preceding stages. Therefore, higher order GRO-based MASH (e.g. MASH 1-1-1) are barely used. The later ADCs suffer from power hungry op-amps and are therefore impractical.

SUMMARY

Described herein are apparatus and methods for noise-shaping enhanced gated ring oscillator (GRO)-based ADCs. In an implementation, a noise-shaping enhanced (NSE) gated ring oscillator (GRO)-based ADC includes a delay configured to delay and feedback an error signal to an input of the NSE GRO-based ADC, where a feedback error signal provides noise shaping and where the error signal is generated at the input of the NSE GRO-based ADC from an input signal, the feedback error signal, and a front-end output signal, a voltage-to-time converter (VTC) configured to convert the error signal to a time domain error signal, a GRO configured to output phase signals from the time domain error signal by oscillating when the time domain error signal is high and inhibiting oscillation when the time domain error signal is not high, a quantization device configured to quantize the phase signals to generate the front-end output signal, where the front-end output signal provides additional noise shaping, a quantization extraction device configured to determine a quantization error from the quantized phase signals, a time-to-digital converter (TDC) configured to digitize the quantization error to generate a back-end output signal, and an output device configured to generate an output signal based on the front-end output signal and the back-end output signal, where the output signal has at least two noise shapings.

BRIEF DESCRIPTION OF THE DRAWINGS

The disclosure is best understood from the following detailed description when read in conjunction with the accompanying drawings. It is emphasized that, according to common practice, the various features of the drawings are not to scale. On the contrary, the dimensions of the various features are arbitrarily expanded or reduced for clarity.

DETAILED DESCRIPTION

Figure 1:
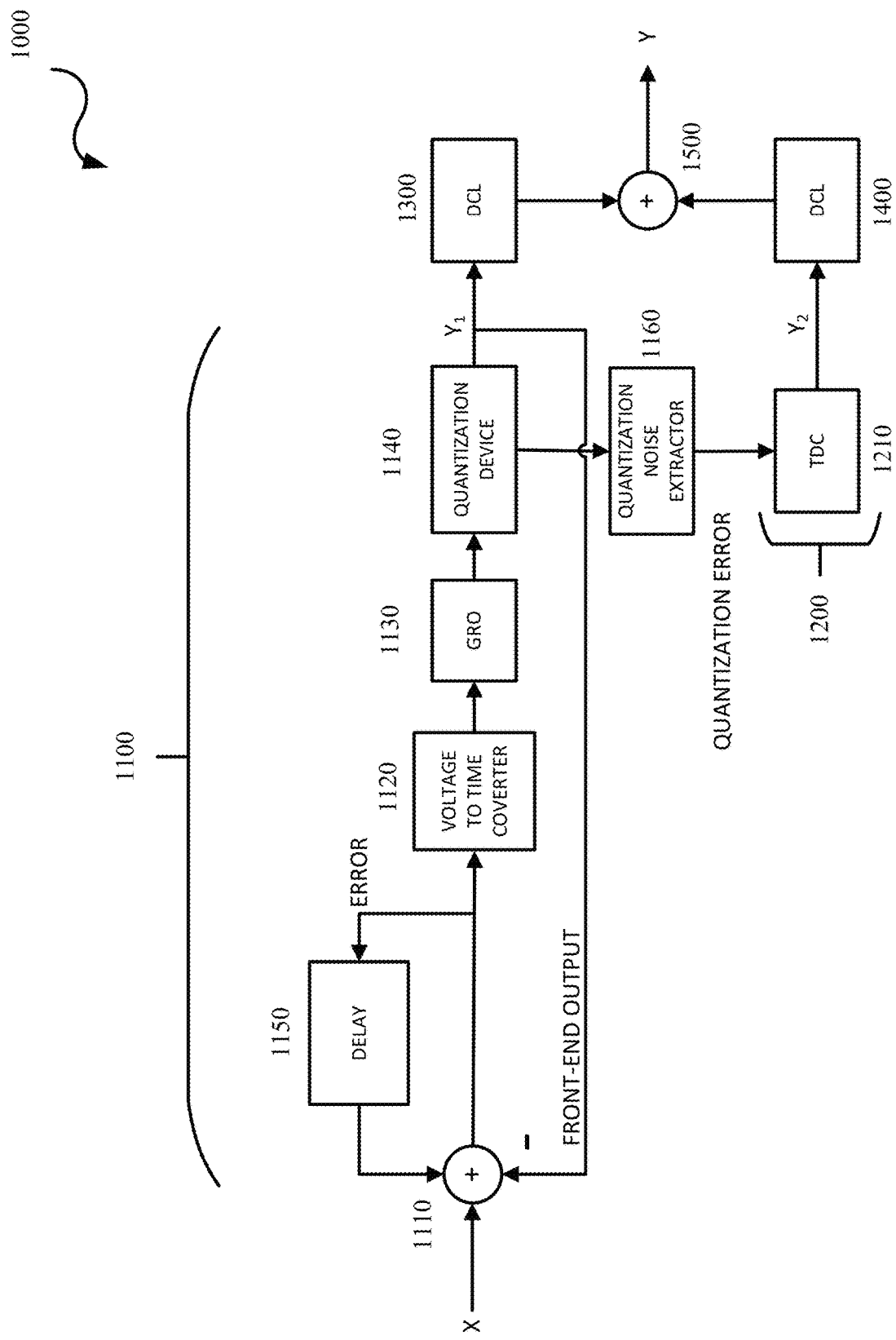
FIG. 1 is a block diagram of an example of noise-shaping enhanced (NSE) gated ring oscillator (GRO)-based ADCs in accordance with some embodiments of this disclosure.

Reference will now be made in greater detail to embodiments of the invention, examples of which are illustrated in the accompanying drawings. Wherever possible, the same reference numerals will be used throughout the drawings and the description to refer to the same or like parts.

As used herein, the terminology "determine" and "identify," or any variations thereof includes selecting, ascertaining, computing, looking up, receiving, determining, establishing, obtaining, or otherwise identifying or determining in any manner whatsoever using one or more of the devices and methods are shown and described herein.

As used herein, the terminology "example," "the embodiment," "implementation," "aspect," "feature," or "element" indicates serving as an example, instance, or illustration. Unless expressly indicated, any example, embodiment, implementation, aspect, feature, or element is independent of each other example, embodiment, implementation, aspect, feature, or element and may be used in combination with any other example, embodiment, implementation, aspect, feature, or element.

As used herein, the terminology "or" is intended to mean an inclusive "or" rather than an exclusive "or." That is unless specified otherwise, or clear from context, "X includes A or B" is intended to indicate any of the natural inclusive permutations. That is if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from the context to be directed to a singular form.

Further, for simplicity of explanation, although the figures and descriptions herein may include sequences or series of steps or stages, elements of the methods disclosed herein may occur in various orders or concurrently. Additionally, elements of the methods disclosed herein may occur with other elements not explicitly presented and described herein. Furthermore, not all elements of the methods described herein may be required to implement a method in accordance with this disclosure. Although aspects, features, and elements are described herein in particular combinations, each aspect, feature, or element may be used independently or in various combinations with or without other aspects, features, and elements.

Further, the figures and descriptions provided herein may be simplified to illustrate aspects of the described embodiments that are relevant for a clear understanding of the herein disclosed processes, machines, manufactures, and/or compositions of matter, while eliminating for the purpose of clarity other aspects that may be found in typical similar devices, systems, compositions and methods. Those of ordinary skill may thus recognize that other elements and/or steps may be desirable or necessary to implement the devices, systems, compositions and methods described herein. However, because such elements and steps are well known in the art, and because they do not facilitate a better understanding of the disclosed embodiments, a discussion of such elements and steps may not be provided herein. However, the present disclosure is deemed to inherently include all such elements, variations, and modifications to the described aspects that would be known to those of ordinary skill in the pertinent art in light of the discussion herein.

Further, although certain circuits are described herein for purposes of illustration, other circuit implementations may be used without departing from the scope of the specification and claims described herein.

Described herein are apparatus, device, and methods for noise-shaping enhanced (NSE) gated ring oscillator (GRO)-based ADCs. The NSE GRO-based ADC has an error signal which is coupled back to an input of the NSE GRO-based ADC while a time time-mode quantization error is extracted from a front-end output and fed into a back-end Nyquist sampling rate or oversampled noise shaping time-to-digital converter (TDC) resulting in MASH 2-0 and MASH 2-1 ΔΣMs, respectively. The error signal is based on the front-end output of the NSE GRO-based ADC. When a Nyquist sampling rate TDC is used, the output of the GRO-based ADC may have an overall noise floor which is substantially lower than the front-end noise floor resulting in an improvement in the overall signal to noise ratio. When an oversampled noise shaping TDC is used, another order of noise-shaping is provided.

In an implementation, a voltage-to-time converter, such as but not limited to, a pulse width modulator (PWM) followed by a GRO-based time-to-digital converter (TDC) is utilized to form the front-end to avoid the voltage-to-frequency (V-to-F) nonlinearities of the voltage-controlled oscillator based quantizers (VCOQs) since GROs operate in an on/off state resulting in a very linear solution. The error signal at the input of the PWM is feedback to the input of the NSE GRO-based ADC. The time-mode quantization noise is extracted in the digital domain (in contrast to the time domain) and digitized by the back-end TDC.

Analog NSE is used to increase the order of the NSE GRO-based ADC. This addresses the issue of increasing the number of stages in a MASH GRO-based ADC, where the quantization noise of the proceeding stages becomes increasingly narrower and is impractical to extract. Consequently, in an implementation, the NSE GRO-based ADC may use an analog delay to couple back the error signal to the input of the NSE GRO-based ADC. In an implementation, a low pass filter may be used to implement the analog delay.

As described herein, the NSE GRO-based ADC may use standard digital cells and is therefore scaling friendly for advanced node processes. For example, the NSE GRO-based ADC may be used in ultra-high-speed applications as the performance is not limited by the bandwidth of operational amplifiers. For example, the NSE GRO-based ADC may be appropriate for implementing Giga sample per second (GS/s) ADCs since the speed is not limited by analog building blocks. In an implementation, the NSE GRO-based ADC may be area and power efficient due to the use of standard digital cells. For example, the NSE GRO-based ADC may be applicable for monitoring applications where different channels are required to monitor different signals. In an implementation, given the area requirements, an NSE GRO-based ADC may be used for each channel to be monitored. In an implementation, multiple channels may be monitored by a single NSE GRO-based ADC.

FIG. 1 is a block diagram of an example of an NSE GRO-based ADC 1000 in accordance with some implementations of this disclosure. The NSE GRO-based ADC 1000 may include a front-end 1100 which is connected to a back-end 1200. The front-end 1100 is further connected to a digital correction logic (DCL) 1300 and the back-end 1200 is further connected to a DCL 1400. The DCL 1300 and the DCL 1400 are further connected to an output summer 1500 for outputting an output Y.

The front-end 1100 may include an input summer 1110 which operates on an input X, a front-end output, and a coupled back error signal. The input summer 1110 is connected to a voltage-to-time converter (VTC) 1120 and a delay 1150. The input summer 1110 outputs an error signal. The error signal may be an analog signal. The VTC 1120 may convert a voltage signal to a time signal. In an implementation, the VTC 1120 may be realized using a pulse width modulator or any like circuit. The output of the VTC 1120 is connected to an input of a GRO 1130, which in turn has an output connected to a quantization device 1140. An output of the quantization device 1140 is connected to the DCL 1300, to a quantization noise extractor 1160, and to the input summer 1110. The back-end 1200 may include a time-to-digital converter (TDC) 1210 which has an input connected to an output of the quantization noise extractor 1160. An output of the TDC 1210 is connected to the DCL 1400. Those of ordinary skill may thus recognize that other elements may be desirable or necessary to implement the NSE GRO-based ADC 1000 described herein. However, because such elements are well known in the art, and because they do not facilitate a better understanding of the disclosed embodiments, a discussion of such elements may not be provided herein.

In an implementation, the GRO 1130 may include a plurality of delay stages configured to enable propagation of an input time signal through the delay stages during an enabled state and configured to inhibit propagation of the input time signal through the delay stages during a disabled state. In other words, the GRO 1130 oscillates when the input time signal is high and freezes its phase otherwise. In an implementation, the GRO 1130 may be implemented using digital cells or components.

In an implementation, the quantization device 1140 may generate a digital representation of the phase or frequency over time output of the GRO 1130. In an implementation, the quantization device 1140 may be a counter. In an implementation, the quantization device 1140 may be a frequency-to-digital converter. In an implementation, the quantization device 1140 may be implemented using digital cells or components.

In an implementation, the quantization noise extractor 1140 may be implemented using exclusive OR (XOR) gates, flip-flops, and the like digital cells or components.

In an implementation, a delay period of the front-end 1100 may be one sample period ($T_S$). In an implementation, a delay period of the delay 1150 may be $T_S$. In an implementation, a delay period of the delay 1150 may be a factor of $T_S$. In an implementation, a delay period of the delay 1150 may be $\alpha T_S$ to $\beta T_S$. For example, the delay period of the delay 1150 may be 0.75 Ts to 1.2 Ts. In an implementation, the delay 1150 may be realized using an analog delay. In an implementation, the delay 1150 may be realized using a sample and hold circuit. In an implementation, the delay 1150 may be realized using an analog filter. In an implementation, the delay 1150 may be realized using a low pass filter (LPF). In an implementation, the delay 1150 may be realized using a first order LPF. In an implementation where a LPF may be used for the delay 1150, a time constant for the LPF may be set to a desired delay $t_d$ and the input frequencies of the LPF may be smaller than $1/t_d$. Accordingly, a group-delay of the LPF is close to the desired delay $t_d$. In an implementation, the time constant of the LPF may be set to $T_S$.

Figure 2:
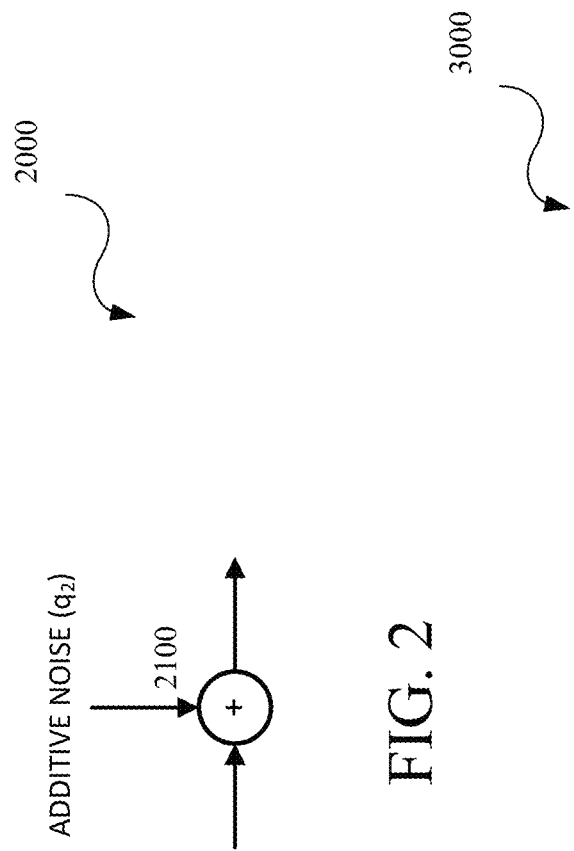
FIG. 2 is a block diagram of an example of a Nyquist sampling rate circuit for NSE GRO-based ADCs in accordance with some embodiments of this disclosure.

In an implementation, the TDC 1210 may implement Nyquist sample rate functionality. FIG. 2 is a block diagram of an example of a Nyquist sampling rate circuit 2000 for an NSE GRO-based ADC in accordance with some embodiments of this disclosure. The Nyquist sampling rate circuit 2000 may include a summer 2100 which operates on the output of the quantization noise extractor 1160 and an additive noise modeled as $q_2$. In an implementation, the TDC 1210 may be implemented using digital cells or components.

Figure 3:
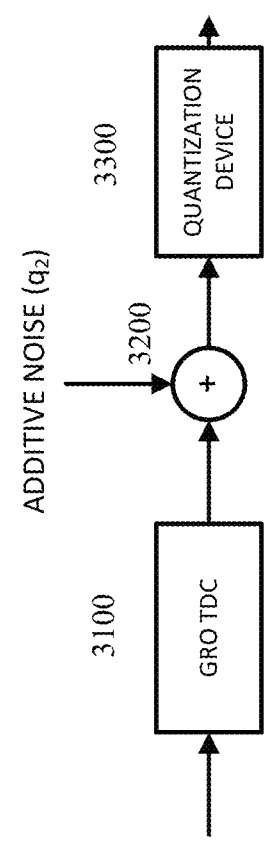
FIG. 3 is a graph of power spectrum density when a Nyquist sampling rate circuit is used in a time-to-digital device in NSE GRO-based ADCs in accordance with some embodiments of this disclosure.

In an implementation, the TDC 1210 may implement oversampling and noise shaping functionality. FIG. 3 is a block diagram of an example of an oversampling and noise shaping circuit 3000 for an NSE GRO-based ADC in accordance with some embodiments of this disclosure. The oversampling and noise shaping circuit 3000 may include a GRO-based TDC device 3100 which intakes the output of the quantization noise extractor 1160. A summer 3200 operates on an output of the GRO-based TDC device 3100 and an additive noise modeled as $q_2$. A quantization device 3300 processes an output of the summer 3200. In an implementation, the TDC 1210 may be implemented using digital cells or components.

In an implementation, the DCL 1300 and the DCL 1400 may be implemented using digital cells or components. In an implementation, the DCL 1300 and the DCL 1400 may be implemented off-chip using, for example but not limited to, computers, digital signal processors, and the like.

Operationally, the VTC 1120 converts the analog error signal to a time domain signal to drive the GRO 1130. The GRO 1130 oscillates when the analog error signal is high and freezes its phase when the analog error signal is low and/or not high. The output phases of the GRO 1130 may be quantized by the quantization device 1140 to generate an output for the front-end 1100. The output of the front-end 1100 (a first stage) is feedback to the input of the NSE GRO-based ADC 1000, i.e., the input summer 1110, while the error signal at the output of the input summer 1110 is feedback or coupled back to the input of the input summer 1110. This provides noise shaping in addition to the noise shaping provided by the VTC 1120, GRO 1130, and the quantization device 1140 of the front-end 1100. Therefore, the front-end 1100 provides at least noise shapings. The quantization error from the front-end 1100 is represented in the time domain and is extracted by the quantization noise extractor 1160 to feed another TDC, i.e., the TDC 1120. The outputs of the front-end 1100 and the back-end 1200 are processed by DCL 1300 and DCL 1400 to correct errors in the digital signals, respectively. The outputs of the DCL 1300 and DCL 1400 are summed by output summer 1500 in the digital domain to generate the output Y.

Figure 4:
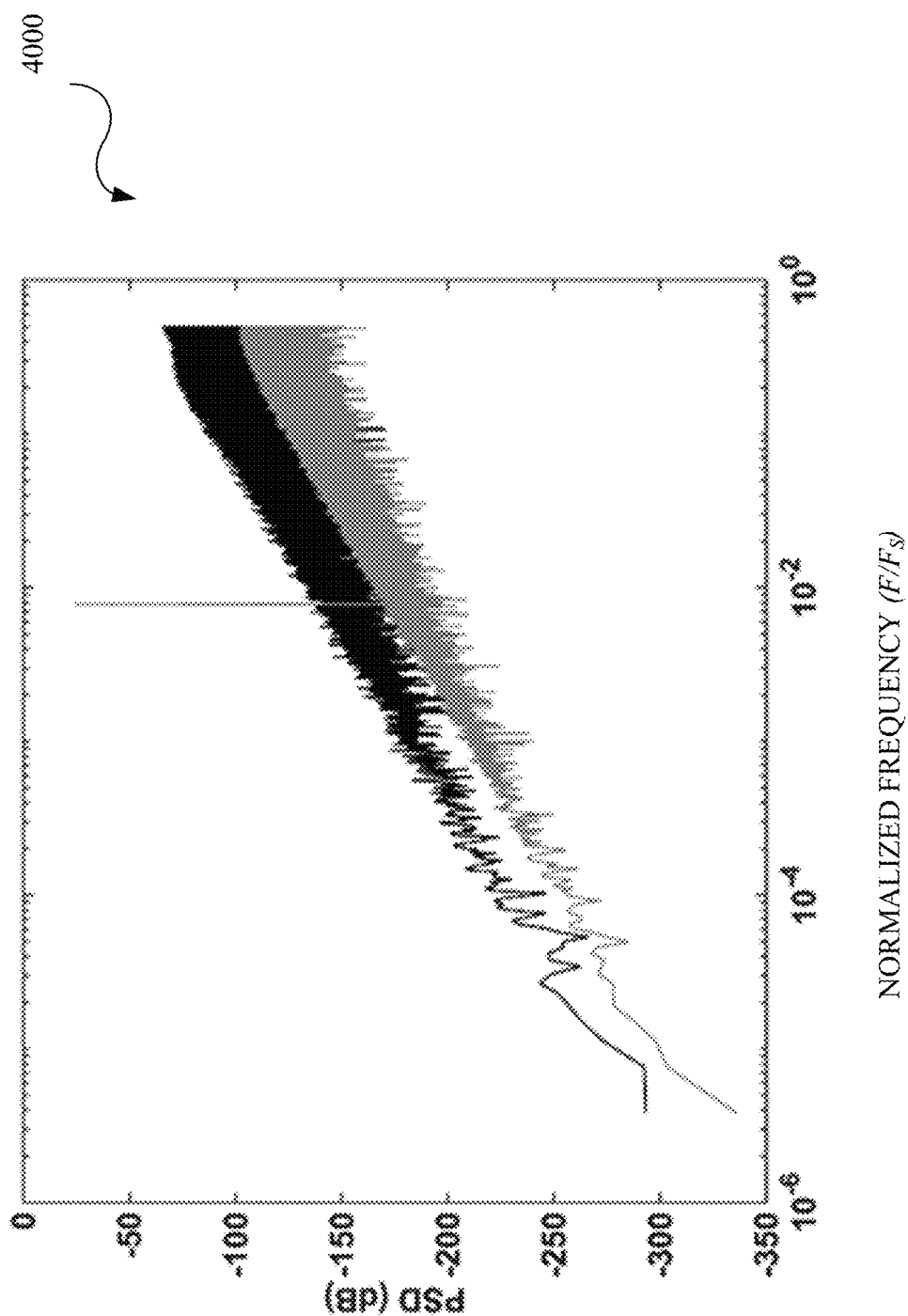
FIG. 4 is a block diagram of an example of an oversampling and noise shaping circuit for NSE GRO-based ADCs in accordance with some embodiments of this disclosure.

As noted above, the TDC 1210 may be realized using a Nyquist sampling rate circuit as shown for example in FIG. 2. FIG. 4 is a graph of power spectrum density (PSD) when a Nyquist sampling rate circuit is used in a TDC such as TDC 1210. The darker or black spectrum shows the output of a front-end such as front-end 1100 while the lighter or gray spectrum illustrates the overall output spectrum of an NSE GRO-based ADC such as the NSE GRO-based ADC 1000. As shown in FIG. 4, the overall noise floor (e.g., of the NSE GRO-based ADC) is substantially lower than the front-end, resulting in an improvement in the overall signal-to-noise ratio (SNR).

Figure 5:
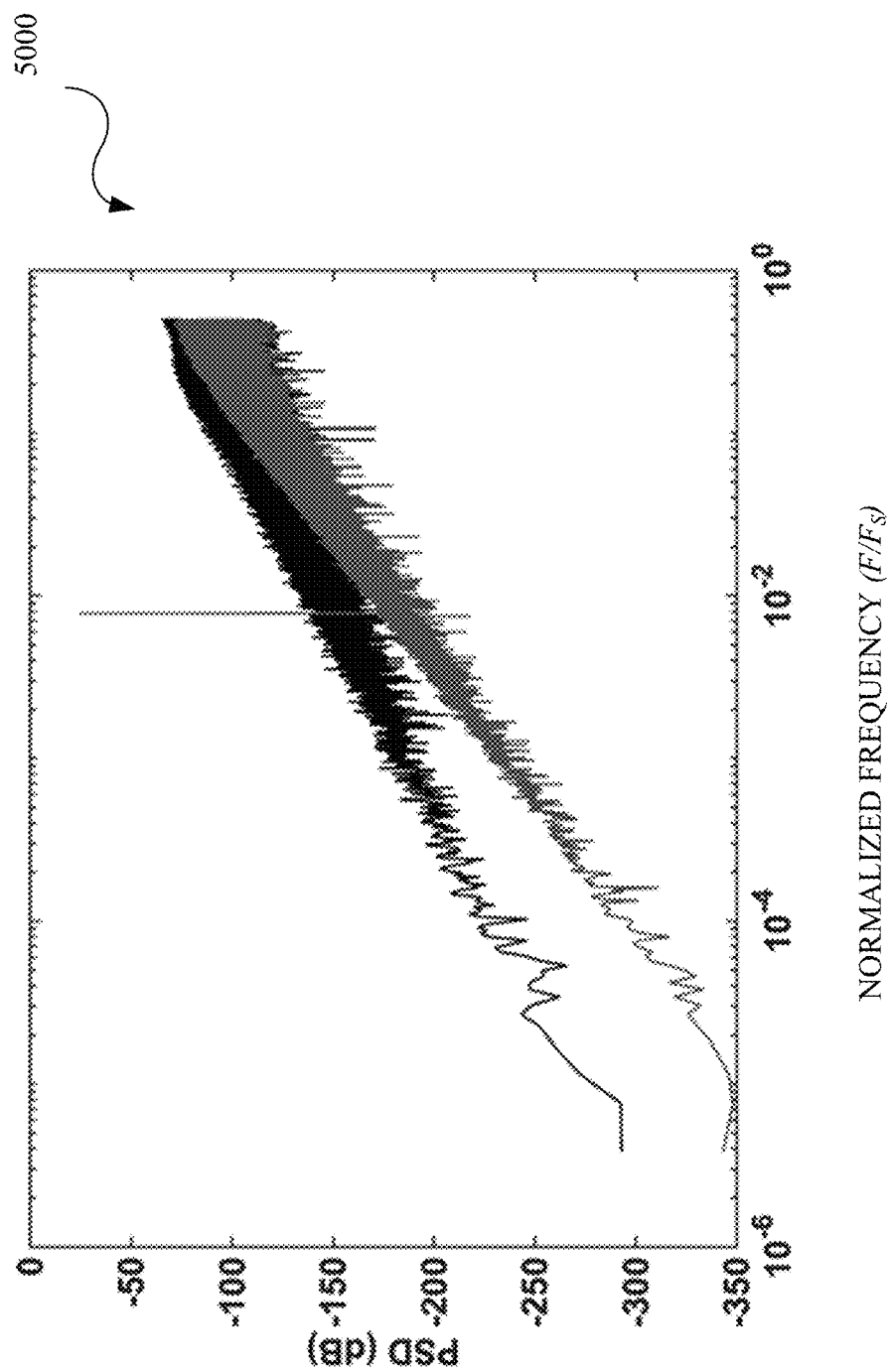
FIG. 5 is a graph of power spectrum density when an oversampling and noise circuit is used in a time-to-digital device in NSE GRO-based ADCs in accordance with some embodiments of this disclosure.

As noted above, the TDC 1210 may be realized using an oversampling and noise enhancing circuit as shown for example in FIG. 3. FIG. 5 is a graph of power spectrum density (PSD) when an oversampling and noise enhancing circuit is used in a TDC such as TDC 1210. The darker or black spectrum shows the output of a front-end such as front-end 1100 while the lighter or gray spectrum illustrates the overall output spectrum of an NSE GRO-based ADC such as the NSE GRO-based ADC 1000. As shown in FIG. 5, the front-end shows a slope of 40 dB/dec while the overall output spectrum of the NSE GRO-based ADC shows a slope of 60 dB/dec. For example, the oversampling and noise enhancing circuit may be a GRO-based TDC in the back-end TDC which provides further noise shaping.

Figure 6:
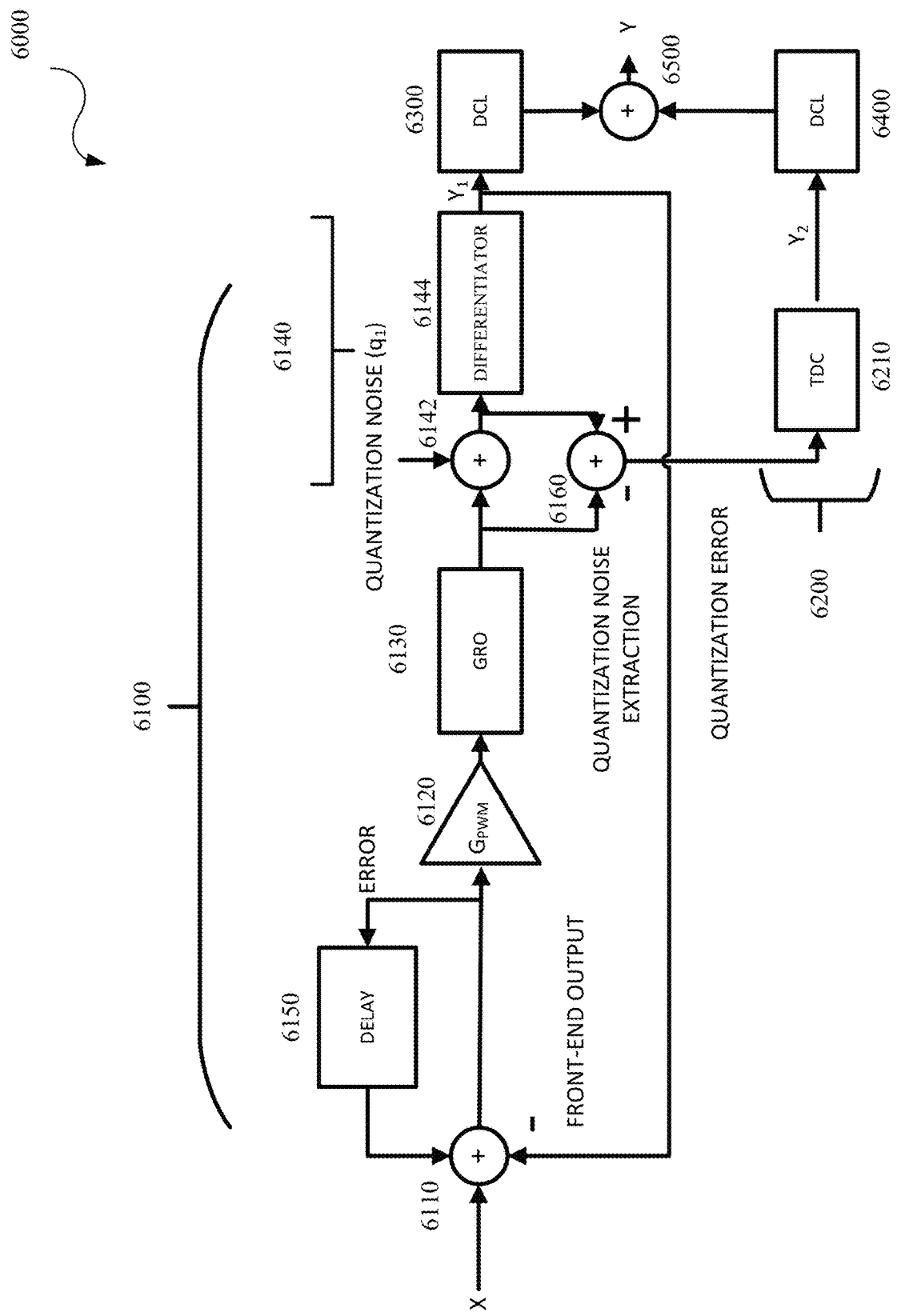
FIG. 6 is a block diagram of an example of NSE GRO-based ADCs in accordance with some embodiments of this disclosure.

FIG. 6 is a block diagram of an example of an NSE GRO-based ADC 6000 in accordance with some implementations of this disclosure. The NSE GRO-based ADC 6000 may include a front-end 6100 which is connected to a back-end 6200. The front-end 6100 is further connected to a digital correction logic (DCL) 6300 and the back-end 6200 is further connected to a DCL 6400. The DCL 6300 and the DCL 6400 are further connected to an output summer 6500 for outputting an output Y.

The front-end 6100 may include an input summer 6110 which operates on an input X, a front-end output, and a coupled back error signal. The input summer 6110 is connected to a pulse width modulator (PWM) 6120 and a delay 6150. The PWM 6120 may be modelled by a gain factor $G_{PWM}$. The input summer 6110 outputs an error signal. The error signal may be an analog signal. The PWM 6120 may convert a voltage signal to a time signal. The output of the PWM 6120 is connected to an input of a GRO 6130, which in turn has an output connected to a quantization device 6140 which may modeled as a summer 6142 and a differentiator 6144, where the summer 6142 adds a quantization noise $q_1$ to the output of the GRO 6130 and the output of the differentiator 6144 is connected to the DCL 6300 and to the input summer 6110.

The output of the GRO 6130 and the output of the summer 6142 are connected to a summer 6160, which functions as a quantization noise extractor to determine a quantization error. The back-end 6200 may include a time-to-digital converter (TDC) 6210 which has an input connected to an output of the summer 6160. An output of the TDC 6210 is connected to the DCL 6400. Those of ordinary skill may thus recognize that other elements may be desirable or necessary to implement the NSE GRO-based ADC 6000 described herein. However, because such elements are well known in the art, and because they do not facilitate a better understanding of the disclosed embodiments, a discussion of such elements may not be provided herein.

In an implementation, the GRO 6130 may include a plurality of delay stages configured to enable propagation of an input time signal through the delay stages during an enabled state and configured to inhibit propagation of the input time signal through the delay stages during a disabled state. In other words, the GRO 6130 oscillates when the input time signal is high and freezes its phase otherwise. The GRO 6130 may be modeled as a continuous time model 1/s. In an implementation, the GRO 6130 may be implemented using digital cells or components.

In an implementation, the quantization device 6140 may generate a digital representation of the phase or frequency over time output of the GRO 6130. In an implementation, the quantization device 6140 may be a counter. In an implementation, the quantization device 6140 may be a frequency-to-digital converter. The quantization device 6140 may be modeled by the quantization noise $q_1$ and the differentiator 6144 as $1-z^{-1}$. In an implementation, the quantization device 6140 may be implemented using digital cells or components.

In an implementation, a delay period of the front-end 6100 may be one sample period ($T_S$). In an implementation, a delay period of the delay 6150 may be $T_S$. In an implementation, a delay period of the delay 6150 may be a factor of $T_S$. In an implementation, a delay period of the delay 6150 may be a 0.75 $T_S$ to 1.2 $T_S$. In an implementation, the delay 6150 may be realized using an analog delay. In an implementation, the delay 6150 may be realized using a sample and hold circuit. In an implementation, the delay 6150 may be realized using an analog filter. In an implementation, the delay 6150 may be realized using a low pass filter. In an implementation, the delay 1150 may be realized using a first order LPF. In an implementation where the LPF may be used for the delay 6150, a time constant for the LPF may be set to a desired delay $t_d$ and the input frequencies of the LPF may be smaller than $1/t_d$. Accordingly, a group-delay of the LPF is close to the desired delay $t_d$. In an implementation, the time constant of the LPF may be set to $T_S$.

In an implementation, the TDC 6210 may implement Nyquist sample rate functionality as shown, for example in FIG. 2 and described herein. In an implementation, the TDC 6210 may implement oversampling and noise shaping functionality as shown, for example in FIG. 3 and described herein. In an implementation, the TDC 6210 may be implemented using digital cells or components.

In an implementation, the DCL 6300 and the DCL 6400 may be implemented using digital cells or components.

Operationally, the PWM 6120 converts the analog error signal to a time domain signal to drive the GRO 6130. The GRO 6130 oscillates when the analog error signal is high and freezes its phase when the analog error signal is low and/or not high. The output phases of the GRO 1130 may be quantized by the quantization device 6140 to generate an output for the front-end 6100. The output of the front-end 6100 (a first stage) is feedback to the input of the NSE GRO-based ADC 6000, i.e., the input summer 6110, while the error signal at the output of the input summer 6110 is feedback or coupled back to the input of the input summer 6110. This provides another order of noise shaping in addition to the noise shaping provided by the PWM 6120, the GRO 6130, and the quantization device 6140 of the front-end 6100. Therefore, the front-end 6100 provides a second order noise shaping. The quantization error from the front-end 6100 is represented in the time domain and is extracted by the quantization noise extractor 1160 to feed another TDC, i.e., the TDC 6120. The outputs of the front-end 6100 and the back-end 6200 are processed by the DCL 6300 and the DCL 6400 to correct errors in the digital signals, respectively. The outputs of the DCL 6300 and DCL 6400 are summed by the output summer 6500 in the digital domain to generate the output Y.

The front-end 6100 noise transfer function (NTF) may be expressed as follows:

$$NTF_1 = \frac{(1-z^{-1})^2}{1+(G_{PWM}-1)z^{-1}}$$

Setting $G_{PWM}=1$ results in a second-order NTF provided by the first stage. A time domain quantization noise is further digitized by the TDC 6210, using either a Nyquist sampling rate TDC or a noise shaping TDC e.g. a GRO-based TDC. In either case, the overall output of the NSE GRO-based ADC 600 may be is expressed as follows:

$$Y(z)=Y_1(z) \cdot DCL_1(z)+Y_2(z) \cdot DCL_2(z)$$

$$DCL_1(z)=STF_2(z)$$

$$DCL_2(z)=NTF_1(z)$$

where $DCL_1$ is the DCL 6300, the $DCL_2$ is the DCL 6400, and $STF_{2(z)}$ (signal transfer function (STF)) is the output of TDC 1210 to the input of TDC 1210. That is, $STF_{2(z)}=$ (output of TDC 1210)/(input of TDC 1210).

Figure 7:
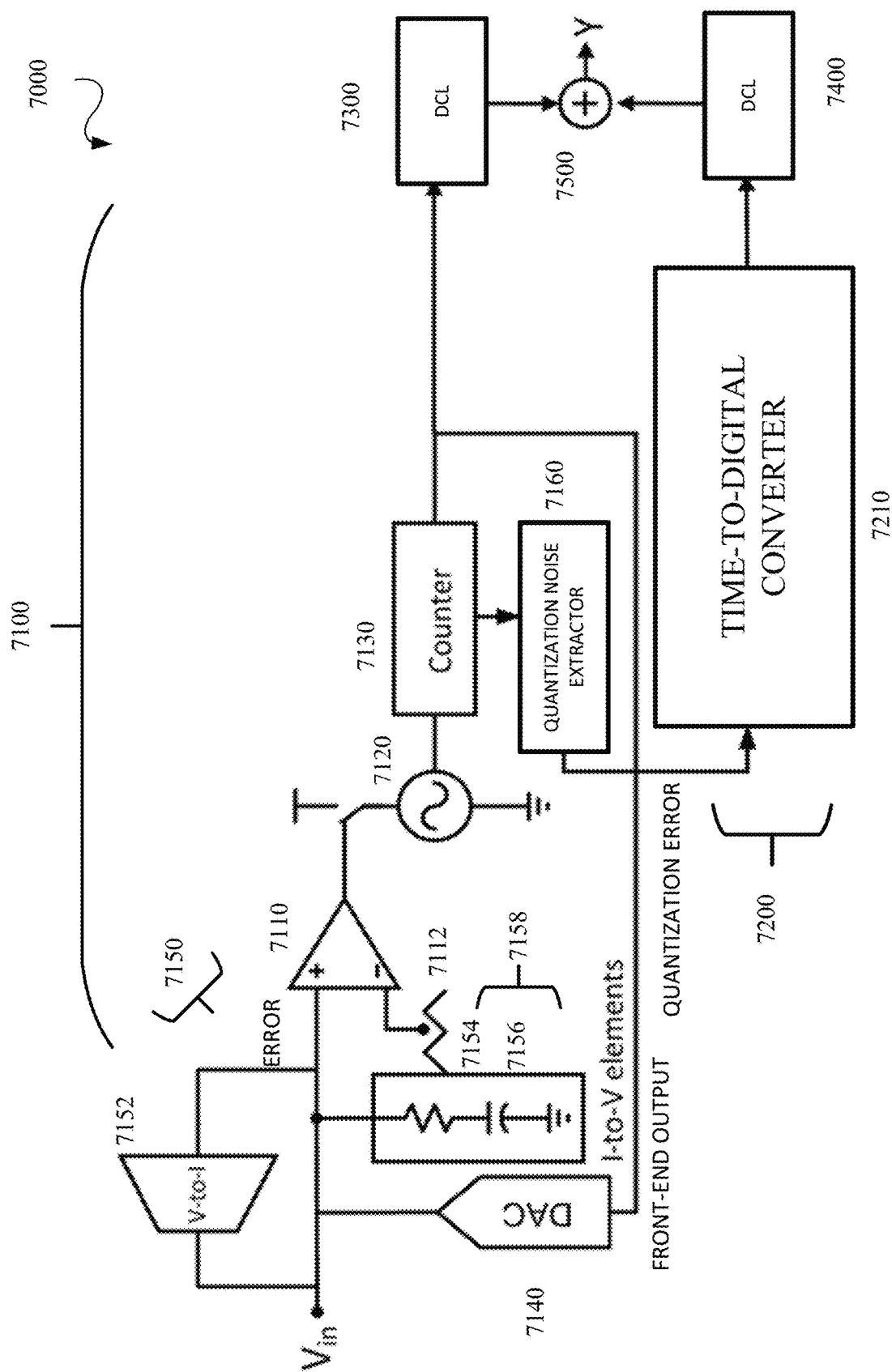
FIG. 7 is a block diagram of an example of NSE GRO-based ADCs in accordance with some embodiments of this disclosure.

FIG. 7 is a block diagram of an example of NSE GRO-based ADC 7000 in accordance with some implementations of this disclosure. The NSE GRO-based ADC 7000 may include a front-end 7100 which is connected to a back-end 7200. The front-end 7100 is further connected to a digital correction logic (DCL) 7300 and the back-end 7200 is further connected to a DCL 7400. The DCL 7300 and the DCL 7400 are further connected to an output summer 7500 for outputting an output Y.

The front-end 7100 may include a comparator 7110, which functions as a VTC by comparing an error signal a triangle waveform 7112 to generate a time-based error signal. The error signal may be generated from an input signal X, a front-end output signal output from the front-end 7100 via a digital-to-analog converter (DAC) 7140, and a feedback error signal output via a LPF 7150. The time-based error signal from the comparator 7110 controls operation of an oscillator 7120 which functions as a GRO, where at a time T the oscillator 7120 is on and the oscillator 7120 is off otherwise. The output of the oscillator 7120 is connected to a counter 7130, which in turn is connected to the DCL 7300, an input of the DAC 7140, and a quantization noise extractor 7160. The back-end 7200 may include a time-to-digital converter (TDC) 7210 which has an input connected to an output of the quantization noise extractor 7160. An output of the TDC 7210 is connected to the DCL 7400. Those of ordinary skill may thus recognize that other elements may be desirable or necessary to implement the NSE GRO-based ADC 7000 described herein. However, because such elements are well known in the art, and because they do not facilitate a better understanding of the disclosed embodiments, a discussion of such elements may not be provided herein.

In an implementation, the counter 7130 may function as a quantizer. In an implementation, the counter 7130 may compute digital values based on the output of the oscillator 7120. In an implementation, the counter 7130 may count a number of rising edges from the output of the oscillator 7120. In an implementation, the counter 7130 may count a number of falling edges from the output of the oscillator 7120. In an implementation, the counter 7130 may count at least one of a number of rising edges or falling edges from the output of the oscillator 7120. In an implementation, the counter 7130 may be implemented using digital cells or components.

In an implementation, the quantization noise extractor 7160 may be implemented using exclusive OR (XOR) gates, flip-flops, and the like digital cells or components.

In an implementation, the DCL 7300 and the DCL 7400 may be implemented using digital cells or components.

In an implementation, the LPF 7150 may function or operate as an analog delay. A time constant for the LPF 7150 may be set to $T_S$, which may be one sample period of the front-end 7100. In effect, the delay $t_d$ is then $T_S$. In an implementation, the LPF 7150 may be implemented using a voltage-to-current (V-to-I) 7152 circuit in combination with a resistor 7154 and capacitor 7156 circuit operating as a current-to-voltage (I-to-V) circuit 7158.

In an implementation, the TDC 7210 may implement Nyquist sample rate functionality as shown, for example in FIG. 2 and described herein. In an implementation, the TDC 7210 may implement oversampling and noise shaping functionality as shown, for example in FIG. 3 and described herein. In an implementation, the TDC 7210 may be implemented using digital cells or components.

Operationally, the comparator 7110 converts the analog error signal to a time domain signal to control or drive the oscillator 7120 as described herein. The output phases of the oscillator 7120 may be quantized or digital values may be computed by the counter 7130. The output of the front-end 7100 (a first stage) is feedback to the input of the NSE GRO-based ADC 7000 through the DAC 7140. At the input of the comparator 7110, the now analog front-end output signal, the input signal X, and the feedback error signal delayed by LPF 7150 are appropriately combined to generate the error signal which is the input to the comparator 7110 and the LPF 7150. That is, the error signal is converted to current by the V-to-I and subtracted from the now analog front-end output signal (i.e., the front-end output signal is a negative feedback). The resulting signal is then converted back to voltage by the I-to-V circuit 7158 to provide a voltage signal at the input of the comparator 7110. The LPF 7150 provides another order of noise shaping in addition to the noise shaping provided via the comparator 7110, the oscillator 7120, and the counter 7130 of the front-end 7100. Therefore, the front-end 7100 provides a second order noise shaping. The quantization error from the front-end 7100 is represented in the time domain and is extracted by the quantization noise extractor 7160 to feed another TDC, i.e., the TDC 7210. The outputs of the front-end 7100 and the back-end 7200 are processed by the DCL 7300 and the DCL 7400 to correct errors in the digital signals, respectively. The outputs of the DCL 7300 and DCL 7400 are summed by the output summer 7500 to generate the output Y.

Figure 8:
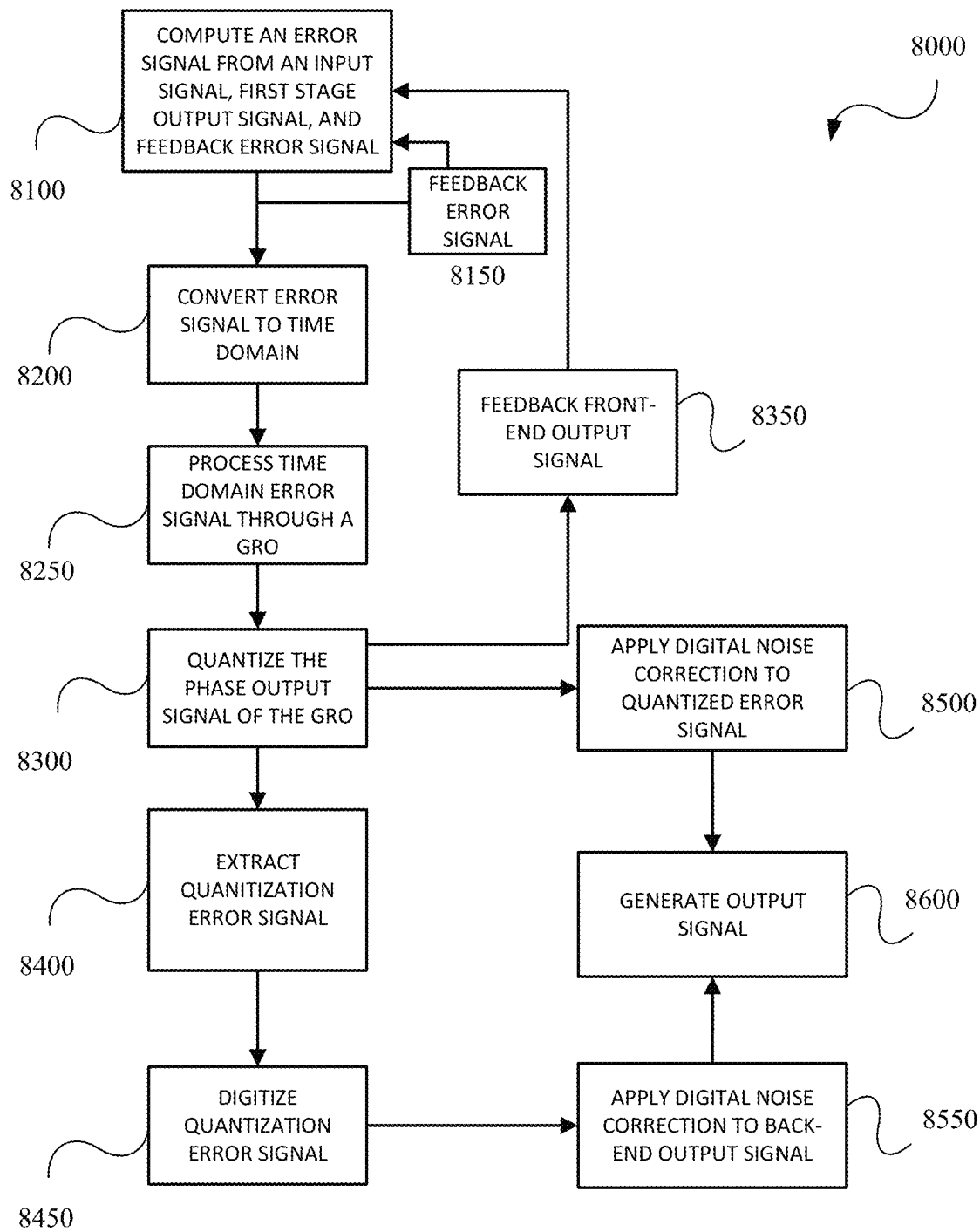
FIG. 8 is a flowchart of an example technique for NSE GRO-based ADCs in accordance with embodiments of this disclosure.

FIG. 8 is a flowchart of an example method 8000 for NSE GRO-based ADCs in accordance with implementations of this disclosure. The method 8000 includes: computing 8100 an error signal from an input signal, a feedback front-end output signal, and a feedback error signal; feeding back 8150 the error signal; converting 8200 the error signal to a time domain; processing 8250 the time domain error signal through a GRO; quantizing 8300 a phase output of the GRO; feeding back 8350 a front-end output signal; extracting 8400 a quantization error signal; digitizing 8450 the quantization error signal in a back-end TDC; applying 8500 digital noise cancellation to the front-end output signal; applying 8550 digital noise cancellation to a back-end output signal; and outputting 8600 an output based on a corrected front-end output signal and a corrected back-end output signal. The method 8000 may be implemented using the NSE GRO-based ADC 1000, the NSE GRO-based ADC 6000, the NSE GRO-based ADC 7000, the NSE GRO-based ADC 8000, the Nyquist sampling rate circuit 3000, and the oversampling and noise shaping circuit 4000, as appropriate The method 8000 includes computing 8100 an error signal from an input signal, a feedback front-end output signal, and a feedback error signal. The error signal is based on an appropriate summation of the input signal, the feedback front-end output signal, and the feedback error signal.

The method 8000 includes feeding 8150 back the error signal to the input of the NSE GRO-based ADC. In an implementation, the feedback includes a delay of $T_S$, which is a sample period of a front-end of the NSE GRO-based ADC. In an implementation, the front-end of the NSE GRO-based ADC culminates with a quantization of a GRO output as described herein. In an implementation, the delay may be a defined factor of $T_S$. In an implementation, the delay may be 0.75 to 1.25 of $T_S$. In an implementation, the delay may be an analog delay, an analog filter, a LPF, or the like. In an implementation, the delayed error signal represents one order of noise shaping in the NSE GRO-based ADC.

The method 8000 includes converting 8200 the error signal to a time domain. The error signal is input to a VTC. In an implementation, the VTC may be a PWM circuit. In an implementation, the VTC may be implemented with a comparator circuit and an appropriate comparator waveform. In an implementation, the comparator waveform may be a triangle waveform.

The method 8000 includes processing 8250 a time domain error signal through a GRO. In an implementation, the GRO outputs a phase signal where the time domain error signal oscillates when the time domain error signal is high or in an enabled state and inhibits oscillation when the time domain error signal is not high or in a disabled state.

The method 8000 includes quantizing 8300 a phase output signal of the GRO. The output of the GRO is input to a quantization device. In an implementation, the quantization device may be a counter, FDC, and the like. In an implementation, the quantization device may determine a digital value representation of the phase output signal.

The method 8000 includes feeding back 8350 a front-end output signal. The quantized phase output signal is the front-end output signal and is feedback to the input of the NSE GRO-based ADC. As described herein, the error signal is based in part on the front-end output signal. In an implementation, the front-end output signal represents one order of noise shaping in the NSE GRO-based ADC.

The method 8000 includes extracting 8600 a quantization error signal. The quantization error signal is extracted in the time domain in contrast to extraction in the voltage domain. In an implementation, the extraction may be based on the number of falling edges in the quantized phase output signal, the number of rising edges in the quantized phase output signal, combinations thereof, and like metrics.

The method 8000 includes digitizing 8700 the quantization error signal in a back-end TDC. The back-end TDC digitizes the quantization error signal. In an implementation, the back-end TDC may be a Nyquist sampling rate circuit which reduces a noise floor of the NSE GRO-based ADC output signal as compared to the front-end output signal. In an implementation, the back-end TDC may be an oversampling and noise enhancing circuit which provides another order of noise shaping to the NSE GRO-based ADC. In an implementation, the oversampling and noise enhancing circuit may be a GRO-based TDC.

The method 8000 includes applying 8800 digital noise cancellation to the front-end output signal. A DCL processes the front-end output signal to remove errors in the now digital signal.

The method 8000 includes applying 8900 digital noise cancellation to a back-end output signal. A DCL processes the back-end output signal to remove errors in the now digital signal.

The method 8000 includes outputting 9000 an output signal based on a corrected front-end output signal and a corrected back-end output signal. The output signal is an appropriate summation of the corrected front-end output signal and the corrected back-end output signal. In an implementation, the output signal has two orders of noise shaping. In an implementation, the output signal has three orders of noise shaping.

In general, a noise-shaping enhanced (NSE) gated ring oscillator (GRO)-based ADC includes a delay configured to delay and feedback an error signal to an input of the NSE GRO-based ADC, where a feedback error signal provides an order of noise shaping and where the error signal is generated at the input of the NSE GRO-based ADC from an input signal, the feedback error signal, and a front-end output signal. The NSE GRO-based ADC further includes a voltage-to-time converter (VTC) configured to convert the error signal to a time domain error signal, a GRO configured to output phase signals from the time domain error signal by oscillating when the time domain error signal is high and inhibiting oscillation when the time domain error signal is not high, a quantization device configured to quantize the phase signals to generate the front-end output signal, where the front-end output signal provides another order of noise shaping, a quantization extraction device configured to determine a quantization error from the quantized phase signals, a time-to-digital converter (TDC) configured to digitize the quantization error to generate a back-end output signal, and an output device configured to generate an output signal based on the front-end output signal and the back-end output signal, wherein the output signal has at least a second order noise shaping. In an implementation, determination of the quantization error is done in the time domain. In an implementation, the TDC is a Nyquist sampling rate circuit, where a noise floor of the output signal is lowered relative to the front-end output signal. In an implementation, the TDC is an oversampling and noise enhancing circuit, where the oversampling and noise enhancing circuit provides a third order of noise shaping. In an implementation, the oversampling and noise enhancing circuit is a GRO-based TDC. In an implementation, the delay is an analog filter. In an implementation, the delay is a low pass filter. In an implementation, the VTC is a pulse width modulator (PWM). In an implementation, the VTC is a comparator, where one input is a comparator signal and another input is the time domain error signal. In an implementation, the quantization device generates digital value representation of the phase signals. In an implementation, the quantization device is a frequency-to-digital converter. In an implementation, the quantization device is a counter. In an implementation, the quantization error is determined from at least one of number of rising edges of the phase output and number of falling edges of the phase output. In an implementation, the NSE GRO-based ADC further includes at least one digital correction logic configured to correct the front-end output signal and the back-end output signal.

In general, a method for noise-shaping enhanced (NSE) gated ring oscillator (GRO)-based ADC includes coupling back a delayed error signal to an input of the NSE GRO-based ADC, where a coupled back error signal provides an order of noise shaping and where the error signal is generated at the input of the NSE GRO-based ADC from an input signal, the coupled back error signal, and a front-end output signal. The error signal is converted to a time domain error signal. Phase signals are generated from the time domain error signal by oscillating when the time domain error signal is enabled and inhibiting oscillation when the time domain error signal is disabled. The phase signals are quantized to generate the front-end output signal, where the front-end output signal provides another order of noise shaping. A quantization error is extracted from the quantized phase signals. The quantization error is digitized to generate a back-end output signal. An output signal is generated based on the front-end output signal and the back-end output signal, wherein the output signal has at least a second order noise shaping. In an implementation, extracting of the quantization error is done in the time domain. In an implementation, the digitizing includes using a Nyquist sampling rate circuit to reduce a noise floor of the output signal relative to the front-end output signal. In an implementation, the digitizing includes using an oversampling and noise enhancing circuit to provide a third order of noise shaping.

In general, a noise-shaping enhanced (NSE) gated ring oscillator (GRO)-based ADC includes a delay configured to delay and feedback an error signal to an input of the NSE GRO-based ADC, where a feedback error signal provides an order of noise shaping and where the error signal is generated at the input of the NSE GRO-based ADC from an input signal, the feedback error signal, and a front-end output signal. The NSE GRO-based ADC includes a GRO configured to output phase signals from a time domain representation of the error signal by oscillating when the time domain representation of the error signal is high and inhibiting oscillation when the time domain representation of the error signal is not high, a quantization device configured to quantize the phase signals to generate the front-end output signal, where the front-end output signal provides another order of noise shaping, a time-to-digital converter (TDC) configured to digitize a quantization error to generate a back-end output signal, where the quantization error is extracted in the time domain from the quantized phase signals, and an output device configured to generate an output signal based on the front-end output signal and the back-end output signal, wherein the output signal has at least a second order noise shaping. In an implementation, the TDC is one of a Nyquist sampling rate circuit, where a noise floor of the output signal is lowered relative to the front-end output signal, and an oversampling and noise enhancing circuit, where the oversampling and noise enhancing circuit provides a third order of noise shaping.

Although some embodiments herein refer to methods, it will be appreciated by one skilled in the art that they may also be embodied as a system or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "processor," "device," or "system." Furthermore, aspects of the present invention may take the form of a computer program product embodied in one or more the computer readable mediums having the computer readable program code embodied thereon. Any combination of one or more computer readable mediums may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer-readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer-readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to CDs, DVDs, wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions.

These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowcharts and block diagrams in the figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures.

While the disclosure has been described in connection with certain embodiments, it is to be understood that the disclosure is not to be limited to the disclosed embodiments but, on the contrary, is intended to cover various modifications, combinations, and equivalent arrangements included within the scope of the appended claims, which scope is to be accorded the broadest interpretation so as to encompass all such modifications and equivalent structures as is permitted under the law.

What is claimed is:

1. A noise-shaping enhanced (NSE) gated ring oscillator (GRO)-based ADC comprising:
  a delay configured to delay and feedback an error signal to an input of the NSE GRO-based ADC, wherein a feedback error signal provides noise shaping and wherein the error signal is generated at the input of the NSE GRO-based ADC from an input signal, the feedback error signal, and a front-end output signal;
  a voltage-to-time converter (VTC) configured to convert the error signal to a time domain error signal;

a GRO configured to output phase signals from the time domain error signal by oscillating when the time domain error signal is high and inhibiting oscillation when the time domain error signal is not high;

a quantization device configured to quantize the phase signals to generate the front-end output signal, wherein the front-end output signal provides additional noise shaping;

a quantization extraction device configured to determine a quantization error from the quantized phase signals;

a time-to-digital converter (TDC) configured to digitize the quantization error to generate a back-end output signal; and an output device configured to generate an output signal based on the front-end output signal and the back-end output signal, wherein the output signal has at least two noise shapings.

2. The NSE GRO-based ADC of claim 1, wherein determination of the quantization error is done in the time domain.

3. The NSE GRO-based ADC of claim 1, wherein the TDC is a Nyquist sampling rate circuit, wherein a noise floor of the output signal is lowered relative to the front-end output signal.

4. The NSE GRO-based ADC of claim 1, wherein the TDC is an oversampling and noise enhancing circuit, wherein the oversampling and noise enhancing circuit provides further noise shaping.

5. The NSE GRO-based ADC of claim 4, wherein the oversampling and noise enhancing circuit is a GRO-based TDC.

6. The NSE GRO-based ADC of claim 1, wherein the delay is an analog filter.

7. The NSE GRO-based ADC of claim 1, wherein the delay is a low pass filter.

8. The NSE GRO-based ADC of claim 1, wherein the VTC is a pulse width modulator (PWM).

9. The NSE GRO-based ADC of claim 1, wherein the VTC is a comparator, wherein one input is a comparator signal and another input is the time domain error signal.

10. The NSE GRO-based ADC of claim 1, wherein the quantization device generates digital value representation of the phase signals.

11. The NSE GRO-based ADC of claim 1, wherein the quantization device is a frequency-to-digital converter.

12. The NSE GRO-based ADC of claim 1, wherein the quantization device is a counter.

13. The NSE GRO-based ADC of claim 1, wherein the quantization error is determined from at least one of number of rising edges of the phase output and number of falling edges of the phase output.

14. The NSE GRO-based ADC of claim 1, further comprising:
at least one digital correction logic configured to correct the front-end output signal and the back-end output signal.

15. A method for noise-shaping enhanced (NSE) gated ring oscillator (GRO)-based ADC, the method comprising:
coupling back a delayed error signal to an input of the NSE GRO-based ADC, wherein a coupled back error signal provides noise shaping and wherein an error signal is generated at the input of the NSE GRO-based ADC from an input signal, the coupled back error signal, and a front-end output signal;

converting the error signal to a time domain error signal;

generating phase signals from the time domain error signal by oscillating when the time domain error signal is enabled and inhibiting oscillation when the time domain error signal is disabled;

quantizing the phase signals to generate the front-end output signal, wherein the front-end output signal provides additional noise shaping;

extracting a quantization error from quantized phase signals;

digitizing the quantization error to generate a back-end output signal; and generating an output signal based on the front-end output signal and the back-end output signal, wherein the output signal has at least two noise shapings.

16. The method of claim 15, wherein the extracting of the quantization error is done in the time domain.

17. The method of claim 15, wherein the digitizing comprising:
using a Nyquist sampling rate circuit to reduce a noise floor of the output signal relative to the front-end output signal.

18. The method of claim 15, wherein the digitizing comprising:
using an oversampling and noise enhancing circuit to provide a third order of noise shaping.

19. A noise-shaping enhanced (NSE) gated ring oscillator (GRO)-based ADC comprising:
a delay configured to delay and feedback an error signal to an input of the NSE GRO-based ADC, wherein a feedback error signal provides noise shaping and wherein the error signal is generated at the input of the NSE GRO-based ADC from an input signal, the feedback error signal, and a front-end output signal;

a GRO configured to output phase signals from a time domain representation of the error signal by oscillating when the time domain representation of the error signal is high and inhibiting oscillation when the time domain representation of the error signal is not high;

a quantization device configured to quantize the phase signals to generate the front-end output signal, wherein the front-end output signal provides additional noise shaping;

a time-to-digital converter (TDC) configured to digitize a quantization error to generate a back-end output signal, wherein the quantization error is extracted in the time domain from quantized phase signals; and an output device configured to generate an output signal based on the front-end output signal and the back-end output signal, wherein the output signal has at least two noise shapings.

20. The NSE GRO-based ADC of claim 19, wherein the TDC is one of:
a Nyquist sampling rate circuit, wherein a noise floor of the output signal is lowered relative to the front-end output signal; and an oversampling and noise enhancing circuit, wherein the oversampling and noise enhancing circuit provides further noise shaping.

* * * * *